US006584202B1

(12) United States Patent
Montag et al.

(10) Patent No.: US 6,584,202 B1
(45) Date of Patent: Jun. 24, 2003

(54) METHOD AND DEVICE FOR REPRODUCING A STEREOPHONIC AUDIOSIGNAL

(75) Inventors: Christoph Montag, Hildesheim (DE); Hermann Holtsmannspoetter, Hildesheim (DE); Ludwig Klapproth, Hildesheim (DE); Christian Vehorn, Hannover (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/508,160

(22) PCT Filed: Apr. 3, 1998

(86) PCT No.: PCT/DE98/00943

§ 371 (c)(1), (2), (4) Date: May 30, 2000

(87) PCT Pub. No.: WO99/13683

PCT Pub. Date: Mar. 18, 1999

(30) Foreign Application Priority Data

Sep. 9, 1997 (DE) ........................................ 197 39 425

(51) Int. Cl.[7] ................................................ H03G 3/00

(52) U.S. Cl. ................................ 381/63; 381/1; 381/86

(58) Field of Search ................................ 381/1, 17, 18, 381/302, 300, 303, 304, 305, 61, 63, 86, 389; 84/630

(56) References Cited

U.S. PATENT DOCUMENTS 4,329,544 A * 5/1982 Yamada ........................ 381/63
4,472,834 A * 9/1984 Yamamuro et al. ........... 381/61
4,953,219 A * 8/1990 Kasai et al. .................. 381/86
5,136,650 A * 8/1992 Griesinger .................... 381/22
5,146,507 A * 9/1992 Satoh et al. .................. 381/86
5,325,435 A * 6/1994 Date et al. ...................... 381/1
5,710,818 A * 1/1998 Yamato et al. ................. 381/1
5,896,456 A * 4/1999 Desper ........................ 381/63

FOREIGN PATENT DOCUMENTS

| | | |
|---|---|---|
| DE | 41 34 130 | 4/1992 |
| EP | 0 034 844 | 9/1981 |
| EP | 0 559 530 | 9/1993 |
| JP | 02 013097 | 1/1990 |
| JP | 03 159500 | 7/1991 |

* cited by examiner

*Primary Examiner*—Xu Mei
(74) *Attorney, Agent, or Firm*—Kenyon & Kenyon

(57) ABSTRACT

A method and an arrangement for reproducing a stereophonic or multi-channel audio signal in a space, particularly in the passenger compartment of a motor vehicle, is described Loudspeakers for reproducing acoustic signals are arranged at a plurality of positions in the space, and an amplitude and phase of the acoustic signals radiated from each loudspeaker are influenced so that wave fronts of the acoustic signals radiated by the loudspeakers overlap to form at least one first resulting wave front for a left channel and a second resulting wave front for a right channel of the stereophonic audio signal, so that the resulting wave fronts intersect in a listening zone within the space, and yield a stereo aural impression inside the listening zone.

10 Claims, 3 Drawing Sheets

METHOD AND DEVICE FOR REPRODUCING A STEREOPHONIC AUDIOSIGNAL

FIELD OF THE INVENTION

The present invention relates to a method and an arrangement for reproducing a stereophonic audio signal in a space, particularly in the passenger compartment of a motor vehicle, with loudspeakers for reproducing acoustic signals being arranged at a plurality of positions in the space.

BACKGROUND INFORMATION

The brochure "Programm '97—Sound und Fahrvergnügen pur. Mobile Kommunikation von Blaupunkt" '97— Sound and Driving Pleasure Through Mobile communication from Blaupunkt published by the firm Blaupunkt describes reproduction devices for audio signals automotive sound systems to which four loudspeakers for reproducing an audio signal can be connected. A first loudspeaker, for example, is being disposed in the door trim panel of the driver-side door, a second loudspeaker is mounted in the door trim panel of the front-seat passenger door, and a third and forth loudspeakers are arranged in the left side and right side of the rear shelf. The levels of the reproduced audio signals for the left and the right stereo channels may be so matched to one another by a balance controller that, for example, a natural stereo aural impression results for the vehicle driver.

Thus, in the case of the conventional automotive sound systems, it is possible to produce a three-dimensional sound effect when reproducing stereophonic audio signals along an imaginary longitudinal axis through the passenger compartment of a motor vehicle. This longitudinal axis is shiftable by the balance controller between the two sides of the vehicle. Therefore, a three-dimensional sound effect can be produced, for example, on the driver side of a motor vehicle, but not equally for the driver side and the front-seat passenger side.

In this context, the term three-dimensional sound effect means that a listener located on the indicated longitudinal axis picks up different signals from the left and right loudspeakers, and thus receives a spatial sound impression, though generally with pronounced in-head localization, head localization means that the listener receives a three-dimensional sound effect, however he fixes the position of the acoustic sources as being close to or in the head.

Therefore, with conventional automotive sound systems, it is not possible to produce a natural stereo aural impression when reproducing stereophonic audio signals in a motor vehicle, or a balanced three-dimensional sound effect for the driver side and the front-seat passenger side in a motor vehicle.

SUMMARY OF THE INVENTION

In contrast, the method and the arrangement of the present invention have the advantage that an equally natural aural impression, with the feeling of a natural distance of the acoustic sources, can be produced when reproducing a stereophonic audio signal within an enlarged listening zone inside the space to be exposed to sound, particularly both on the driver side and on the front seat passenger side inside of the passenger compartment of a motor vehicle. In this context, the impression of a natural distance of the acoustic sources corresponds to the aural impression of a listener who is actually sitting in a concert hall and locates the position of the instruments according to their actual position. For that purpose, it is also necessary that, for the listener, the impression be given of fixing the position of the acoustic sources outside of the space to be exposed to sound. This is made possible by the method and the arrangement of the present invention.

It is particularly advantageous that, given suitable control of the loudspeakers arranged in the space, the enlarged listening zone for which a natural stereo aural impression results includes the largest part of the space to be exposed to sound, thus, for example, the rear seat within the motor vehicle as well.

A further advantage is that the control for controlling the individual loudspeakers arranged in the space conditions the signals for each individual loudspeaker with respect to amplitude and phase. Thus, the control also takes into account the reflections occurring within the space to be exposed to sound, i.e., their influence on the natural stereo aural impression within the listening zone.

The arrangement and method of the present invention are easily implemented by using digitalized audio signals and a digital signal processing, e.g., in the form of a digital signal processor.

Furthermore, it is advantageous that, when using the arrangement and the method, respectively, of the present invention in a motor vehicle, the signal corrections necessary for the individual loudspeakers can be prepared as a data record for various vehicle types, and thus for variably configured passenger compartments, and can be activated during the final assembly of the vehicle.

DETAILED DESCRIPTION

The purpose of the present invention is to permit a natural aural impression of a stereophonic audio signal, reproduced in a space, at a multitude of positions within the space, in that the audio signals for the left and the right stereo channels, having the same level, are felt to be equally loud at all these positions. This is achieved according to present invention by arranging a plurality of loudspeakers either along a straight line or around the space. The loudspeakers are controlled so that the wave fronts of the acoustic signals radiated by the loudspeakers overlap to form at least one first resulting wave front for the left channel and a second resulting wave front for the right channel of the stereophonic audio signal, and the resulting wave fronts intersect in a listening zone within the space. The resulting wave fronts represent lines of equal amplitude for the left and right channels, respectively, of the stereo audio signal. Therefore, points at which the audio signals for the right and left channels are felt to be equally loud result at all the positions within the space at which the two resulting wave fronts intersect, yielding a stereo aural impression at these points.

Figure 1:
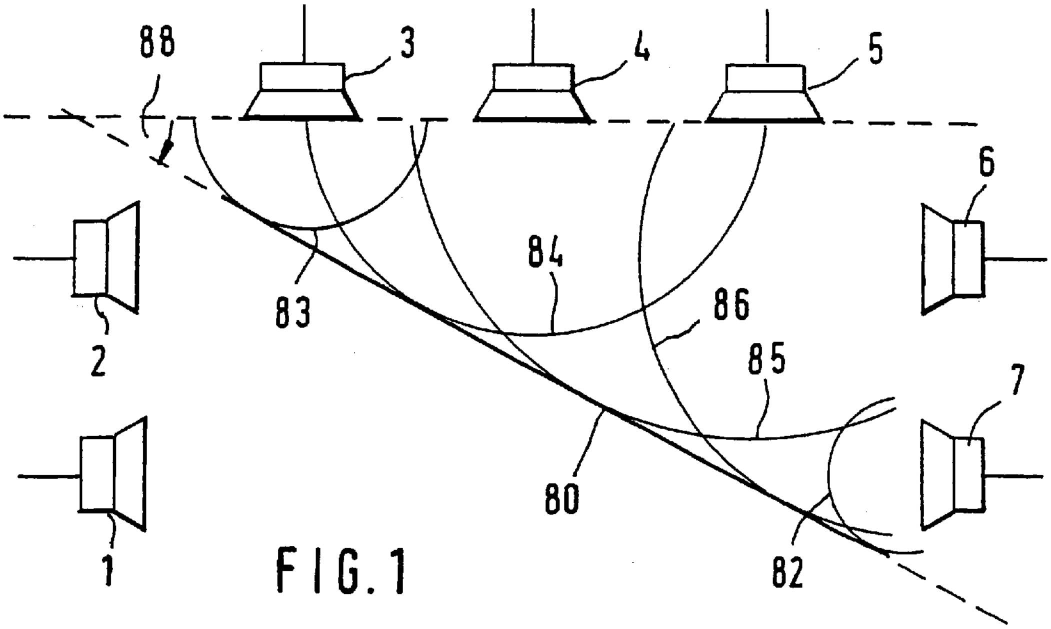
FIG. 1 shows a schematic representation of an operating principle of an arrangement and a method of the present invention, using a motor vehicle passenger compartment as an example.

The method of the present invention is described in the following, with reference to FIG. 1, using a loudspeaker arrangement disposed in passenger compartment 10 of a motor vehicle as an example.

In passenger compartment 10 of the motor vehicle, loudspeakers 1 through 7 are arranged along the sides of the vehicle and along the dashboard, according to the present exemplary embodiment. Loudspeakers 1 and 7 are disposed in the left and right rear side paneling, loudspeakers 2 and 6 are arranged in the left and right front door trim panels, loudspeakers 3 and 5 are mounted in the left and right corners of the dashboard, and loudspeaker 4 is arranged in the middle of the dashboard.

To generate a resulting wave front 80, which is straight in the present case, for the right channel of the stereo audio signal—wave front 80 being radiated at an angle 88 of greater than 0°, in the order of magnitude of 45° with respect to the transverse axis, e.g., with respect to the dashboard of the motor vehicle in the present case—loudspeakers 3 through 7 are controlled with the audio signal for the right stereo channel, accompanied by influencing of the audio-signal phase and amplitude, in such a way that wave fronts 83 through 87 radiated by individual loudspeakers 3 through 7 overlap to form the resulting wave front 80. To that end, as shown in FIG. 1, the audio signal for the right channel is first of all radiated from right loudspeaker 5, so that wave front 85 emanating from loudspeaker 5 is already the furthest advanced at the point of time shown in FIG. 1. Loudspeaker 6, loudspeaker 4, loudspeaker 3 and loudspeaker 7 then receive the audio signal for the right channel with a preselected time delay. In the present case, the time-staggered control of the individual loudspeakers by one and the same signal is implemented by suitably dimensioned time-delay elements.

To generate resulting wave front 80, which is intended to have a constant signal amplitude over its entire profile, during the radiation of the audio signal by individual loudspeakers 3 through 7, an amplitude correction factor is also taken into account that compensates for the amplitude—decreasing in response to the increasing distance of the respective wave front from the loudspeaker as a result of the free-space loss—with approximately the reciprocal of the distance from the respective loudspeaker.

In an analogous manner, in the present example, to generate a resulting wave front for the left channel of the stereo audio signal that, that propagates in the passenger compartment of the motor vehicle at an angle of, e.g., 180°–88, thus opposed diagonally with respect to the resulting wave front 80 for the right channel, loudspeakers 1 through 5 receive the audio signal for the left stereo channel, influenced in phase and amplitude.

As a result of the propagation of the two resulting wave fronts, whose propagation directions in each case have a first portion parallel to, and a second portion transverse to an imaginary axis through the space to be exposed to sound, the second portions having contrary directions, the two resulting wave fronts intersect within a broad space, characterized as the listening zone, inside the passenger compartment of the motor vehicle. Since the two resulting wave fronts represent locations of constant amplitude for the signal of the left and the right channels, a natural stereo aural impression results within the listening zone.

Figure 2:
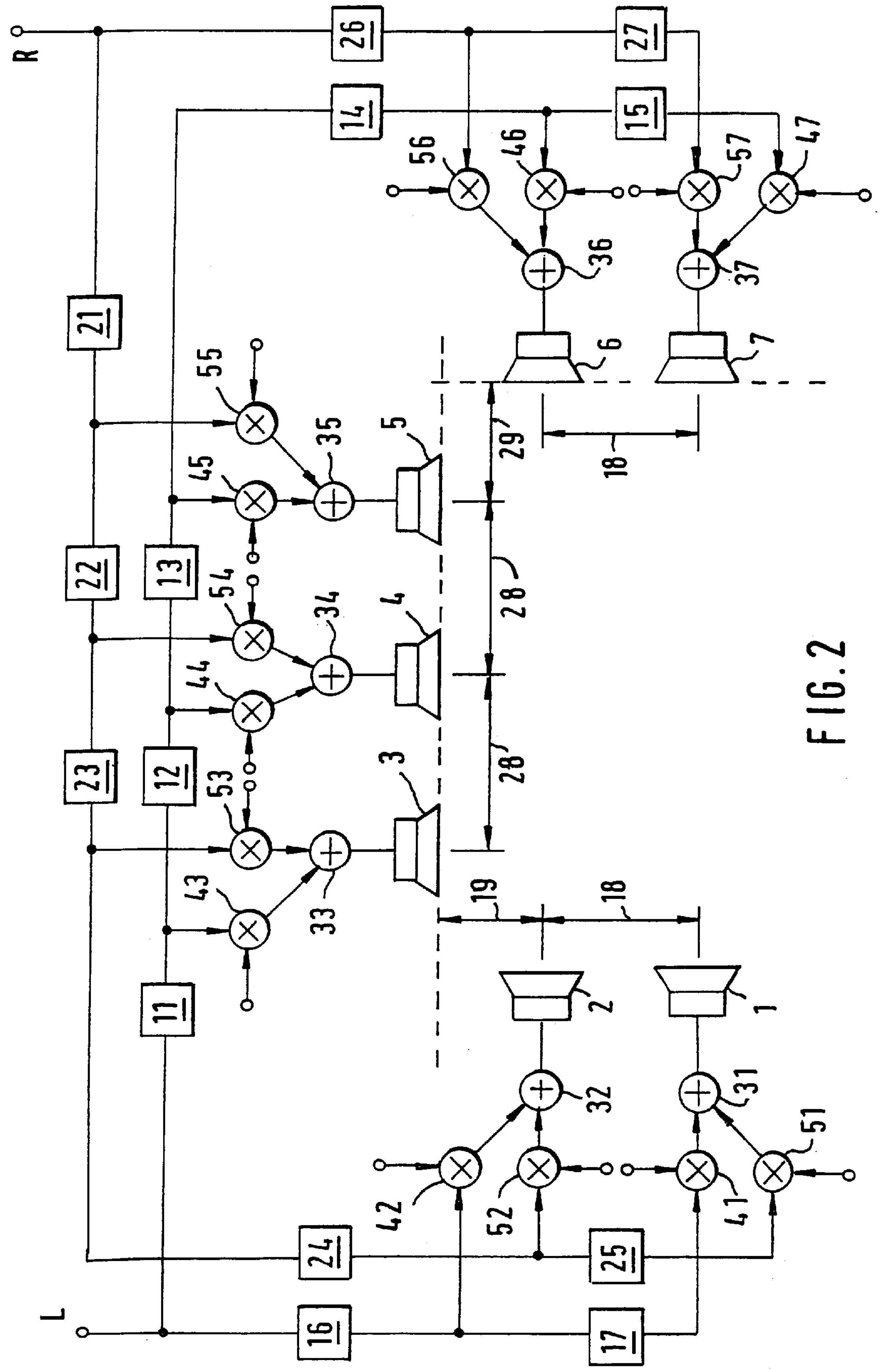
FIG. 2 shows a first embodiment of an arrangement of the present invention for use in a motor vehicle.

An example for the control of loudspeakers 1 through 7 is shown in FIG. 2.

One summing element 31 through 37 is connected in incoming circuit to each of loudspeakers 1 through 7, in each case a weighted and time-delayed audio signal for the left and the right channels is supplied to each summing element 31 through 37. Thus, all of the loudspeakers 1 through 7 receive signal portions for the left and the right channel of the stereo signal. The weighting of the signal portions for the left and the right audio channel, and thus the control of the amplitude of the signal portions reproduced by the individual loudspeakers, is effected by multipliers 41 through 47 and 51 through 57, which are each supplied with the signal portions for the left and right audio channels, as well as weighting factors for their influence. To control the phase or the propagation time of the signals radiated by the individual loudspeakers, chains of time-delay elements 11 through 17 for the left channel and 21 through 27 for the right channel are connected in incoming circuit to the multipliers.

The functioning method of the arrangement shown in FIG. 2 shall be explained in more detail based on the following example. Loudspeakers 1 and 2, as well as 6 and 7 arranged in the side panelings have a distance 18 relative to one another of 0.6 m in the present example; loudspeakers 3, 4 and 5 disposed in the dashboard in each case have a distance 28 relative to one another of 0.4 m. Furthermore, distance 29 of loudspeakers 3 and 5, arranged in the corners of the dash board, to the side panelings, i.e., the radiating surface of loudspeakers 1 and 2, as well as 6 and 7 arranged in the side panelings, is 0.3 m in the present case, and the distance of loudspeakers 2 and 6, arranged in the door trim panels, to the dashboard is 0.45 m.

To generate a resulting wave front 80 for the right channel that advances diagonally from the front right corner to the rear left corner of the passenger compartment, as well as a resulting wave front for the left channel that propagates from the front left corner to the rear right corner of the passenger compartment, in the present exemplary embodiment, the values for time-delay elements 21 through 27 for the right channel and 11 through 17 for the left channel, as well as weighting factors supplied to multipliers 41 through 47 for the right channel and 51 through 57 for the left channel, were determined as follows:

| | | |
|---|---|---|
| 21, | 11: | 20 * ra, |
| 22, | 12: | 43 * $r_a$, |
| 23, | 13: | 43 * $r_a$, |
| 24, | 14: | 68 * $r_a$, |
| 25, | 15: | 49 * $r_a$, |
| 26, | 16: | 25 * $r_a$, |
| 27, | 17: | 49 * $r_a$, |

with sampling rate $r_a$ being equal to the reciprocal of sampling frequency $f_a$ of 44.1 kHz in the present case.

The weighting factors for influencing the amplitude of the audio signals radiated by the individual loudspeakers were selected as follows:

| | | |
|---|---|---|
| 41, | 57: | 0.1 |
| 42, | 56: | 0.2 |
| 43, | 55: | 0.5 |
| 44, | 54: | 0.5 |
| 45, | 53: | 0.5 |
| 46, | 52: | 0.2 |
| 47, | 51: | 0.1 |

From this it follows that, for example, signal R for the right channel is initially reproduced via loudspeaker 5 after a first time delay 21 of 20*$r_a$ and weighting in multiplier 55 with the factor 0.5, via loudspeaker 6 after a time delay 26 of 25*$r_a$ and weighting in multiplier 56 with the factor 0.2, via loudspeaker 4 after a time delay 21+22 of (20+43)*$r_a$ and weighting with the factor 0.5 in multiplier 54, via loudspeaker 7 after a delay 26+27 of (25+49)*$r_a$ and weighting with 0.1 in multiplier 57, via loudspeaker 3 after a delay 21+22+23 of (20+43+43)*$r_a$ and weighting in multiplier 53, via loudspeaker 2 after delay in delay stages 21, 22, 23 and 24 by (20+43+43+68)*$r_a$ and weighting with 0.2 in multiplier 52, and finally via loudspeaker 1 after delay by (20+43+43+68+49)*$r_a$ in delay stages 21 through 25 and multiplication with 0.1 in multiplier 51. The signal for the left channel is also reproduced in an analogous manner.

It turns out that, to generate the resulting wave front for the right channel, the resulting wavefront's propagation direction including a first portion along the longitudinal axis through the interior of the vehicle and a second portion from the right to the left side of the vehicle, loudspeakers 1 and 2 disposed on the left side of the vehicle also receive a portion of audio signal R for the right channel. This portion of the resulting wave front 80, produced by the loudspeakers arranged on the left side, for the signal of the right channel is used to compensate for the influence of reflections, which impair the formation of the even resulting wave front.

Figure 3:
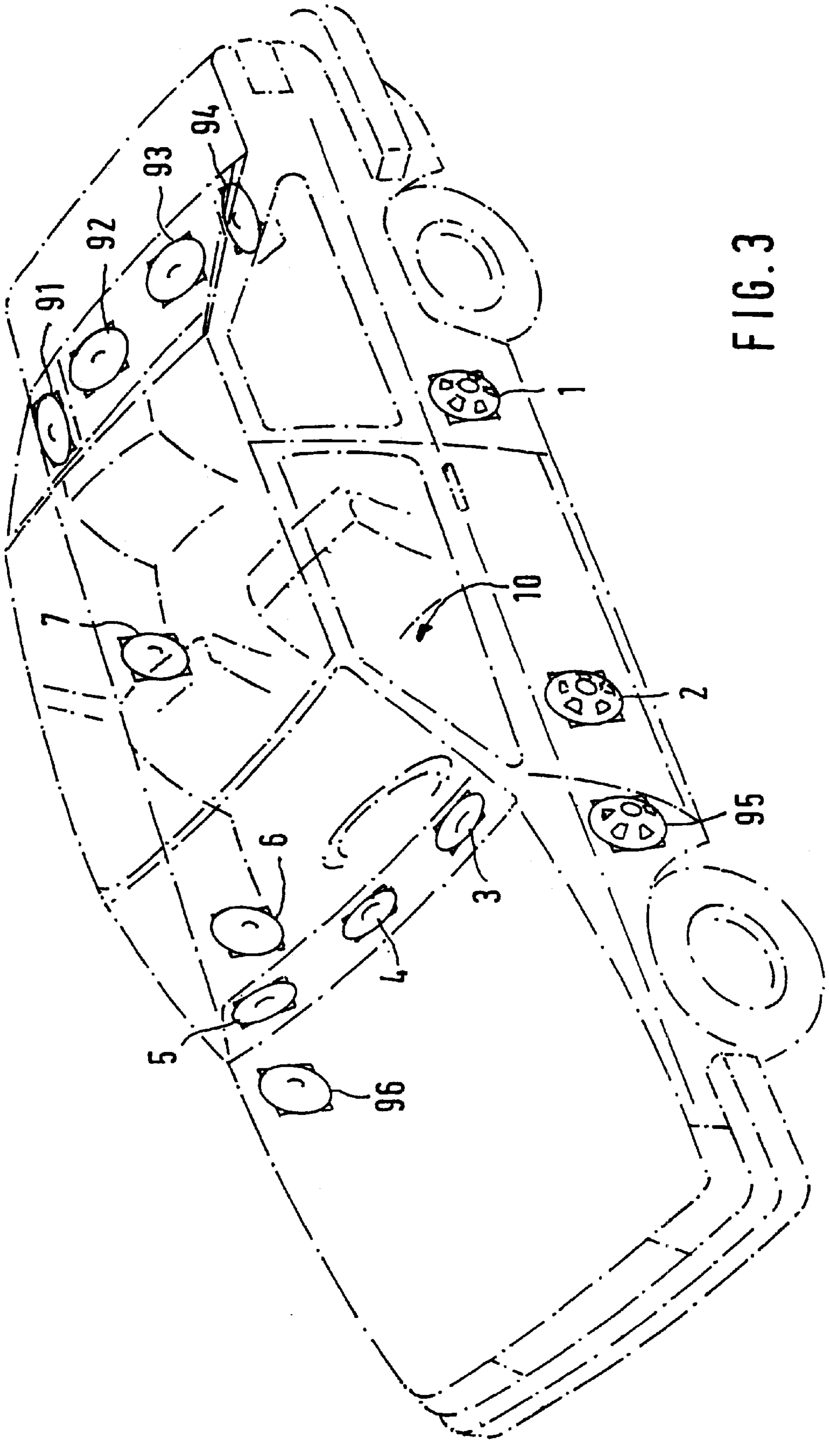
FIG. 3 shows a plurality of possible mounting locations for loudspeakers in a passenger compartment of a motor vehicle.

FIG. 3 shows a plurality of possible mounting locations for loudspeakers according to the arrangement of the present invention. In addition to the side panelings and the dashboard where loudspeakers 1 through 7 are already arranged, the rear shelf is also suitable for accommodating further loudspeakers, four loudspeakers 91 through 94 in the present case, and the outer regions of the footwells on the driver and front-seat passenger sides are suitable for accommodating additional loudspeakers 95 and 96.

In the present example, in which the passenger compartment is completely surrounded by loudspeakers 1 through 7 and 91 through 94, as well as 95 and 96, it is also conceivable to reproduce not only stereophonic, but also audio signals distributed, for example, over the front and rear regions. In this case, not just two, but three, four or more resulting wave fronts are produced by the control shown in FIG. 2 and expanded accordingly.

Figure 4:
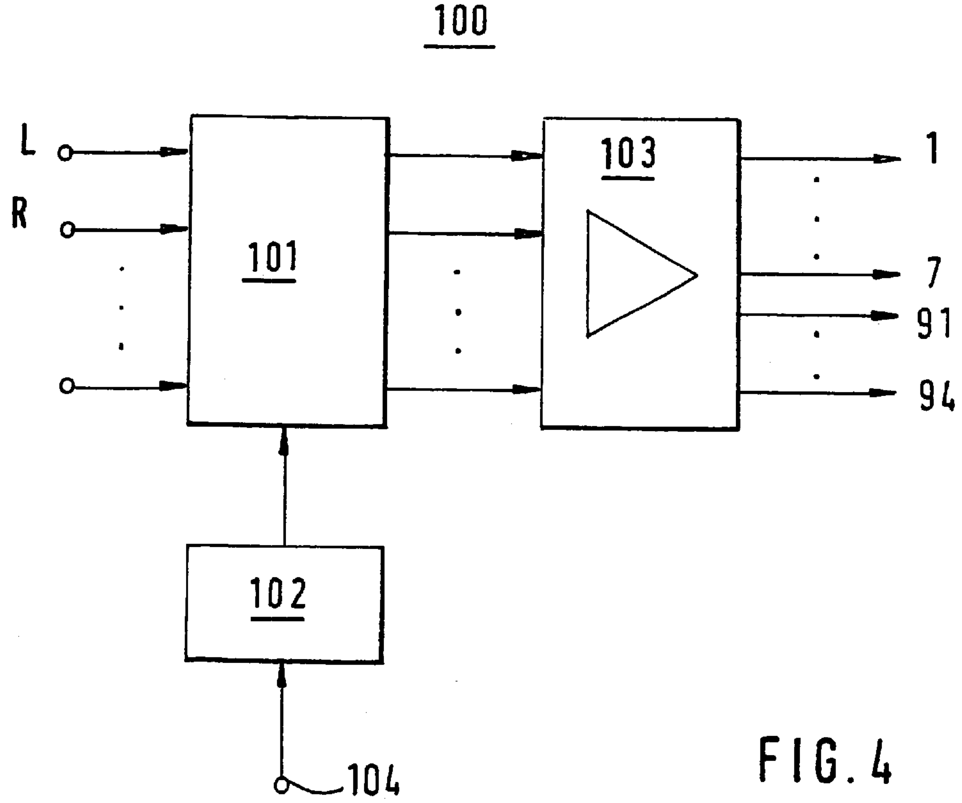
FIG. 4 shows a block diagram of a part of an automotive sound system according to the present invention.

FIG. 4 shows a block diagram of a part of an automotive sound system 100 as a reproduction device for stereophonic or multi-channel audio signals according to the present invention.

Signals L and R for the left and right audio channels, as well as possibly further signals for other audio channels, are fed to a digital signal processor 101, which includes the control, i.e., the time-delay elements, the multipliers and the summers of the arrangement according to FIG. 2. The values for the delays of the time-delay elements, as well as the weighting factors supplied to the multipliers are taken from a memory device 102. The signals for controlling the individual loudspeakers 1 through 7, as well as possibly further loudspeakers 91 through 96, are available at the output of the digital signal processor and, after amplification in a low-frequency amplifier 103, are supplied to the loudspeakers.

It is within the scope of the present invention for a plurality of data records for variably configured spaces, e.g., the passenger compartments of various automobile types, to be stored in memory device 102, whereby during installation of the automotive sound system in the motor vehicle, a data record, allocated to the type of automobile, is activated by the input of a code specific to the type of automobile via control input 104 of memory device 102 for processing in digital signal processor 101.

It is within the scope of the present invention for the data records to be determined in advance, either by measurements in a model motor vehicle, or else by simulations.

Also within the scope of the invention is that, in the course of the measurements or simulations, influences by reflections of the audio signals on the profile of the resulting wave fronts are taken into account. Thus, for example, to correctly determine the delay times and the amplitudes of the signal portions radiated by loudspeakers 91 through 94 arranged on the rear shelf, it is important that the signal portions radiated by the horizontally arranged loudspeakers 91 through 94 not be radiated directly, but rather be radiated, reflected by the rear window, into the interior of passenger compartment 10. The longer path covered in this case is taken into account when determining the propagation times and the amplitudes of the signal portions to be radiated by these loudspeakers.

What is claimed is:

1. A method for reproducing a stereophonic audio signal in a space, the stereophonic audio signal having a left channel and a right channel, the method comprising the steps of:

arranging loudspeakers for reproducing acoustic signals at a plurality of positions in the space;

supplying each of the loudspeakers with signals of the left channel and the right channel, the signals being individually delayed and amplitude-weighted for each of the loudspeakers; and adjusting a delay and an amplitude-weighting of audio signals reproduced via the loudspeakers so that wave fronts of acoustic signals radiated by the loudspeakers overlap to form at least one first resulting wave front for the left channel and a second resulting wave front for the right channel, the resulting wave fronts exhibiting a constant phase and amplitude along their profile, the resulting wave fronts intersecting in an expanded listening zone within the space, the listening zone including a plurality of listening positions distant from one another, a stereo aural impression resulting inside the listening zone.

2. The method according to claim 1, wherein the space includes a passenger compartment of an automobile.

3. An arrangement for reproducing a stereophonic audio signal in a space, the stereophonic audio signal having a left channel and a right channel, the arrangement comprising:

loudspeakers arranged at a plurality of positions within the space, the loudspeakers reproducing acoustic signals;

a first device allocated to each of the loudspeakers, the first device overlapping signals of the left channel and the right channel of an audio signal to be reproduced;

a second device allocated to each of the loudspeakers, the second device individually influencing a phase and an amplitude of the signals of the left channel and the right channel for each of the loudspeakers, the phase and the amplitude of audio signals reproduced by the loudspeakers being selected so that wave fronts of acoustic waves radiated by the loudspeakers overlap to form a first resulting wave front for the left channel and a second resulting wave front for the right channel of the stereophonic audio signal, a phase and an amplitude of the stereophonic audio signal being constant along the resulting wave fronts, the resulting wave fronts meeting in a region of a listening zone within the space, the listening zone including a plurality of listening positions distant from one another, a stereophonic aural impression resulting in the region of the listening zone.

4. The arrangement according to claim 3, wherein:

the space includes a passenger compartment of a motor vehicle.

5. The arrangement according to claim 3, wherein:

the loudspeakers are arranged within the space around the listening zone.

6. The arrangement according to claim 3, further comprising:

a control device for controlling the loudspeakers, the control device including time-day elements influencing phases of the acoustic signals radiated by each of the loudspeakers so that the resulting wave fronts formed by the overlapping of wave fronts of the acoustic signals radiated by each of the loudspeakers exhibit a preselected profile.

7. The arrangement according to claim 5, wherein:

the preselected profile is linear.

8. The arrangement according to claim 3, further comprising:

a control device for controlling the loudspeakers, the control device including at least one of amplifiers and attenuators, the at least one of amplifiers and attenuators having amplification factors adjusted so that a constant amplitude is yielded along the resulting wave fronts formed by the overlapping of wave fronts of the acoustic signals radiated by each of the loudspeakers.

9. The arrangement according to claim 6, wherein:

the loudspeakers are arranged outside of the listening zone at least one of transversely and parallel to an imaginary longitudinal axis through the space; and delay values of the time-delay elements of the control device are calculated so that propagation directions of each of at least two of the resulting wave fronts have a first portion parallel to the imaginary logitudinal axis and a second portion transverse to the imaginary logitudinal axis, the second portion of each of the at least two of the resulting wave fronts having contrary directions.

10. The arrangement according to claim 6, wherein:

the space is a passenger compartment of a motor vehicle;

the loudspeakers are arranged outside of the listening zone at least one of transversely to a travel direction and along the travel direction; and delay values of the time-delay elements of the control device are calculated so that propagation directions of each of at least two of the resulting wave fronts have a first portion parallel to an imaginary logitudinal axis and a second portion transverse to the imaginary logitudinal axis, the second portion of each of the at least two of the resulting wave fronts having contrary directions.

* * * * *